(12) United States Patent
Zhao et al.

(10) Patent No.: US 7,269,014 B1
(45) Date of Patent: Sep. 11, 2007

(54) HEAT DISSIPATION DEVICE

(75) Inventors: Liang-Hui Zhao, Guangdong (CN); Yi-Qiang Wu, Guangdong (CN)

(73) Assignees: Fu Zhun Precision Industry (Shen Zhen) Co., Ltd., Shenzhen, Guangdong Province; Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/308,280

(22) Filed: Mar. 15, 2006

(51) Int. Cl.
*H05K 7/20* (2006.01)

(52) U.S. Cl. .................. 361/700; 361/695; 361/709; 361/720; 165/80.3; 165/104.33

(58) Field of Classification Search ............... 361/697, 361/699–703, 709–710, 718–719, 694–695; 165/80.3–80.5, 104.33, 185
See application file for complete search history.

(56) References Cited

U.S. PATENT DOCUMENTS

| | | | |
|---|---|---|---|
| 6,189,601 B1 * | 2/2001 | Goodman et al. ......... 165/80.3 |
| 7,110,259 B2 * | 9/2006 | Lee et al. ............... 361/700 |
| 2005/0141198 A1 | 6/2005 | Lee et al. |
| 2005/0183849 A1 * | 8/2005 | Ko et al. ............. 165/104.33 |
| 2005/0247437 A1 | 11/2005 | Ying et al. |
| 2006/0054307 A1 * | 3/2006 | Lee et al. .............. 165/80.3 |

* cited by examiner

*Primary Examiner*—Jayprakash Gandhi
*Assistant Examiner*—Robert J. Hoffberg
(74) *Attorney, Agent, or Firm*—Winston Hsu

(57) ABSTRACT

A heat dissipation device for dissipating heat from an electronic element includes a heat spreader (12) for contacting with the electronic element, a conducting member (30) having a lower base plate (32) thermally contacting with the heat spreader and an upper base plate (34) with a plurality of first fins (36) extending downwardly from the upper base plate towards the lower base plate and a connecting portion (33) interconnecting the lower and upper base plate. A plurality of second fins (38) is mounted on the conducting member. A plurality of heat pipes (40) thermally connects the heat spreader and the conducting member and the second fins to transfer heat from the heat spreader to the conducting member and the second fins. A fan (20) is mounted adjacent to air passages of the first and second fins for generating a forced airflow through the air passages.

14 Claims, 3 Drawing Sheets

HEAT DISSIPATION DEVICE

FIELD OF THE INVENTION

The present invention generally relates to a heat dissipation device, and more particularly to a heat dissipation device having a high heat dissipating capacity.

DESCRIPTION OF RELATED ART

As computer technology continues to advance, electronic components such as central processing units (CPUs) of computers are being made to provide faster operational speeds and greater functional capabilities. When a CPU operates at high speed in a computer enclosure, its temperature can increase greatly. It is desired to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer. A conventional heat dissipation device attached to the CPU comprises a heat sink, and at least a pair of heat pipes which have evaporating sections located close to the CPU for absorbing heat generated by the CPU and condensing sections for transferring the heat away from the CPU. The heat pipes are used to enhance the heat transfer speed of the heat dissipation device from a place near the CPU to a place far from the CPU. By the provision of the heat pipes, heat dissipation efficiency of the heat dissipation device is improved.

However, as computer technology becomes more and more complicated, the conventional heat dissipation device can not satisfy the demand of the heat dissipation of the CPU which produces more and more heat than before. The heat dissipating capacity of the conventional heat dissipation device needs improvement greatly. A factor that can determine the heat dissipating capacity of the heat dissipation device is the heat dissipating ability of condensing sections of the heat pipes. Working liquid in the heat pipes absorbs the heat from the CPU and evaporates into vapor at evaporating sections of the heat pipes. The vapor releases the heat at the condensing sections whereby the vapor is condensed into liquid. The speed of the heat release of the vapor affects the performance of the heat pipes and accordingly the performance of the heat dissipation device incorporating the heat pipes. The heat dissipating ability of the condensing sections affects the heat release of the vapor. Generally the condensing sections are fitted with fins to enhance the heat dissipating ability thereof. However, there is a relatively small temperature gradient between the evaporating sections and the condensing such that a design of the conventional heat dissipation device is not effective enough to meet the more and more demanding heat dissipation requirement of modern electronic devices.

SUMMARY OF INVENTION

A heat dissipation device in accordance with a preferred embodiment of the present invention comprises a heat spreader for contacting with an electronic element, a conducting member having a lower base plate thermally contacting with the heat spreader and an upper base plate with a plurality of first fins extending downwardly from the upper base plate towards the lower base plate and a connecting portion interconnecting the lower and upper base plates. A plurality of second fins is mounted on the conducting member. A plurality of heat pipes thermally connects the heat spreader and the conducting member and the second fins to transfer heat from the heat spreader to the conducting member and the second fins. A fan is mounted adjacent to air passages of the first and second fins for generating a forced airflow through the air passages. Heat carried by vapor in the heat pipes is able to be quickly released at condensing portions of the heat pipes. Therefore, the heat dissipating capability of the heat pipes and the heat dissipation device is enormously improved.

Other advantages and novel features will become more apparent from the following detailed description of preferred embodiments when taken in conjunction with the accompanying drawings, in which:

DETAILED DESCRIPTION

Figure 1:
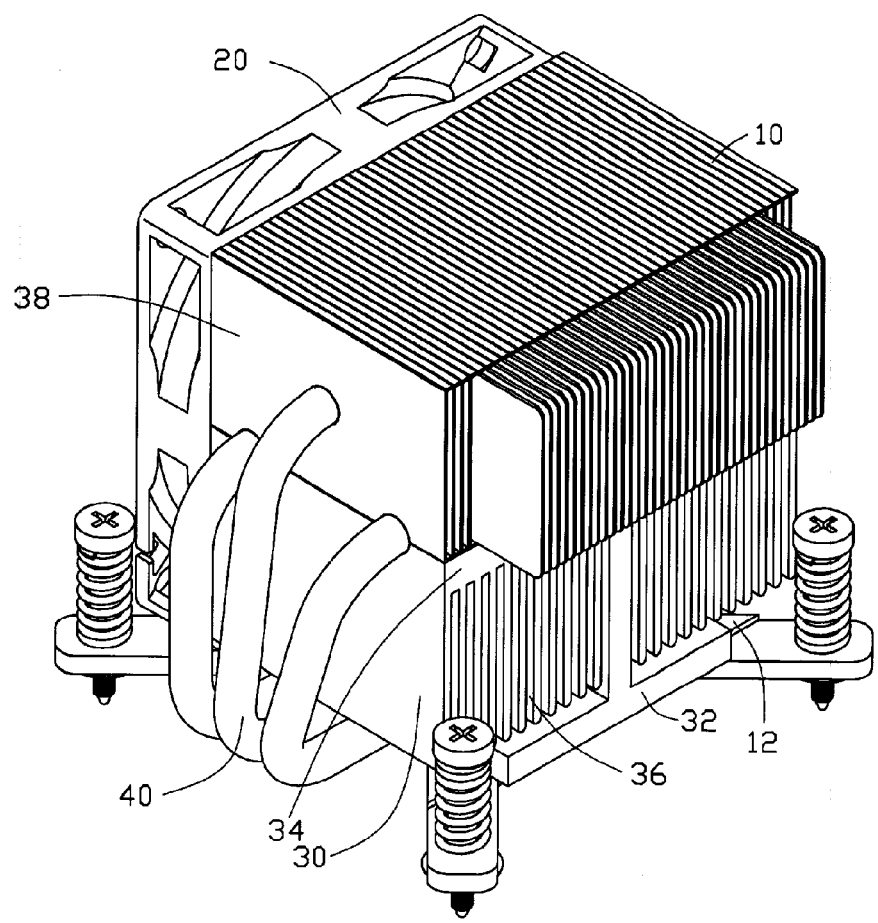
FIG. 1 is an isometric view of a heat dissipation device in accordance with a preferred embodiment of the present invention.

Reference will now be made to the drawing figures to describe a heat dissipation device in accordance with a preferred embodiment of the present invention.

Figure 2:
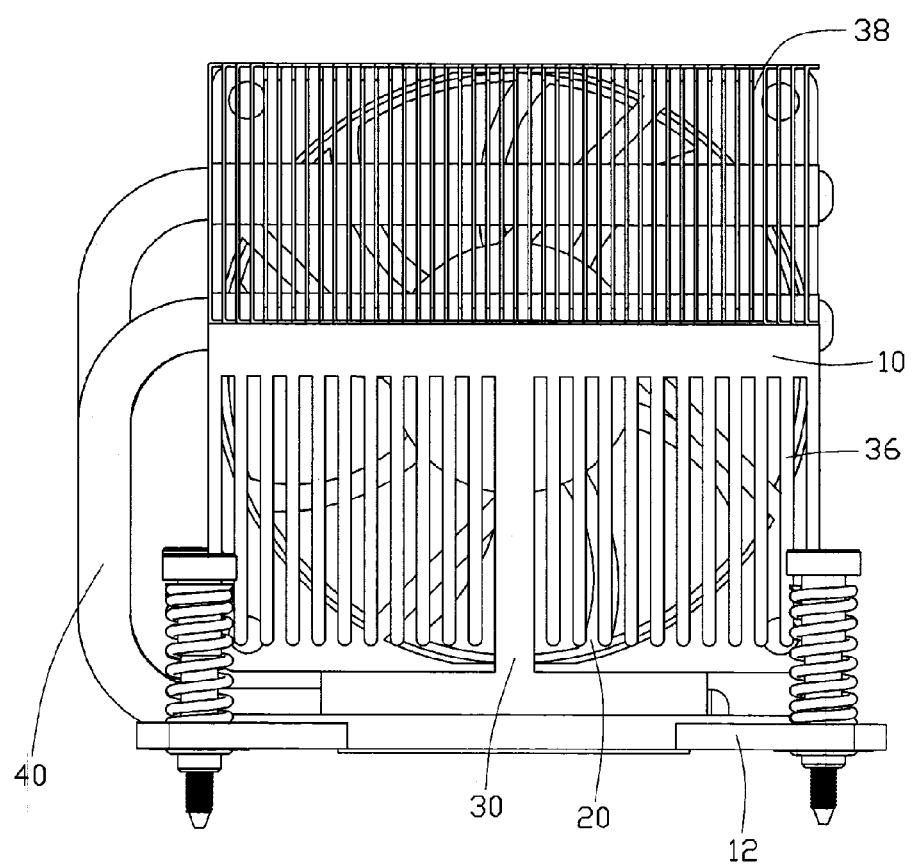
FIG. 2 is a front elevational view of FIG. 1.

Referring to FIGS. 1-2, the heat dissipation device is for being mounted to a heat-generating electronic element, such an IC package (not shown), to dissipate heat therefrom. The heat dissipation device comprises a heat sink 10 having a cubical configuration, and a fan 20 mounted to a lateral side of the heat sink 10.

The heat sink 10 comprises a heat spreader 12 and a conducting member 30 mounted on the heat spreader 12. A plurality of first fins 36 is integrally formed with the conducting member 30. A plurality of second fins 38 is vertically provided on the conducting member 30. Three U-shaped heat pipes 40 thermally connect the heat spreader 12, a top of the conducting member 30 and the second fins 38.

Figure 3:
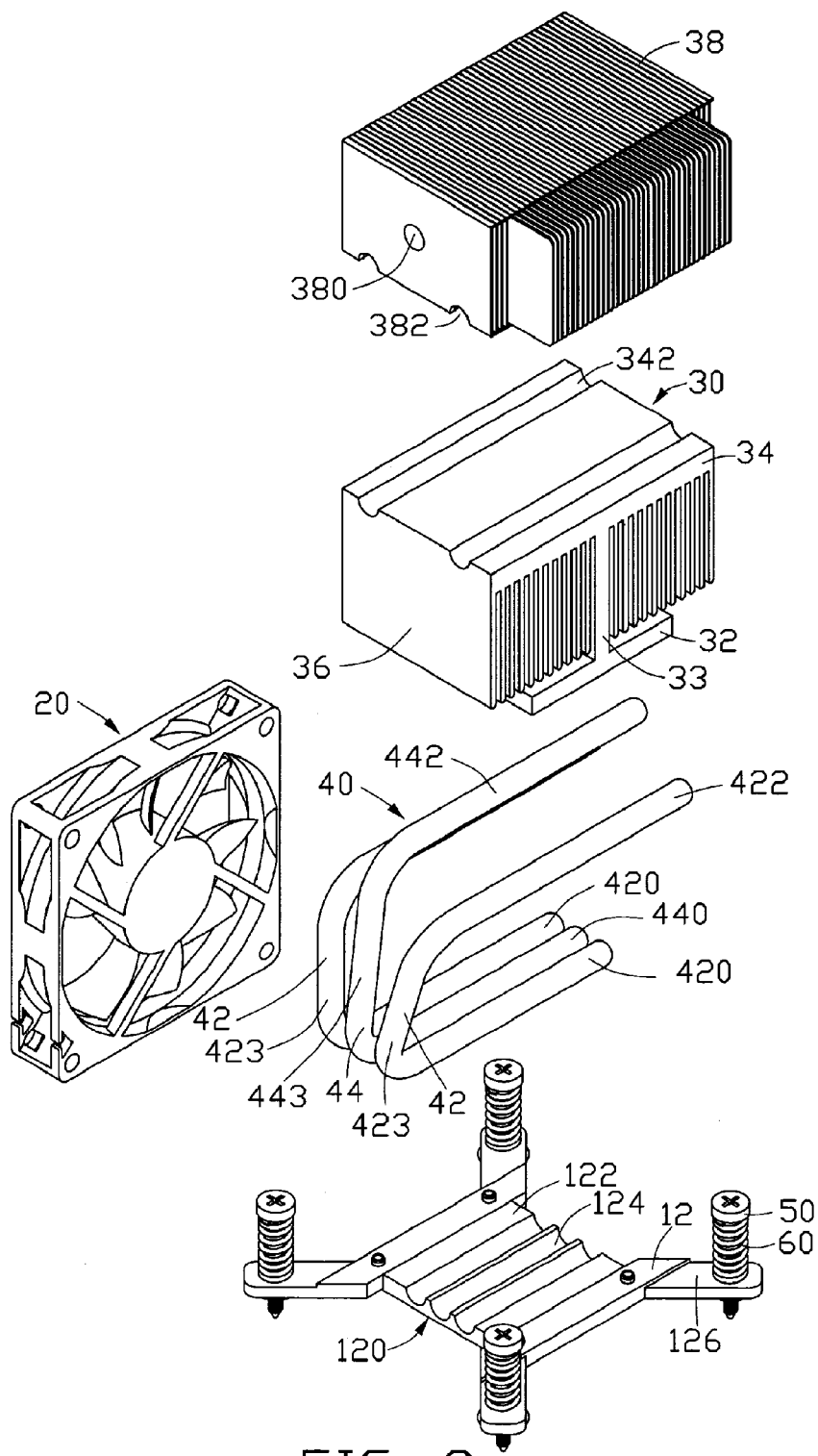
FIG. 3 is an exploded view of FIG. 1.

Referring to FIG. 3, the heat spreader 12 has a bottom face 120 for contacting the electronic element to absorb the heat therefrom, and a top face 122 with three grooves 124. The heat spreader 12 forms four ears 126 at four corners thereof. Each ear 126 defines a mounting hole (not labeled) for receiving a screw 50 with a spring 60 to fix the heat dissipation device to a supporting member (not shown), for example, a printed circuit board on which the electronic element is mounted.

The conducting member 30 is mounted on the heat spreader 12 and comprises a lower base plate 32, an upper base plate 34 parallel to the lower base plate 32 and spaced from the lower base plate 32, and a connecting portion 33 connecting middle portions of the upper base plate 34 and the lower base plate 32. The conducting member 30 is formed by metal extrusion, such as aluminum extrusion. The upper base plate 34 has a length longer than that of the lower base plate 32. The upper base plate 34 defines a pair of grooves 342 in a top thereof. The lower base plate 32 defines three grooves (not shown) in a bottom thereof, corresponding to the grooves 124 of the heat spreader 12. The first fins 36 extend downwardly from a bottom surface of the upper base plate 34 of the conducting member 30, pointed to the lower base plate 32. The first fins 36 are arrayed as two groups at two opposite sides of the connecting portion 33 of the conducting member 30, respectively. There is a space between a bottom of the first fins 36 and the lower base plate 32. The first fins 36 define a plurality of first air passages (not labeled) therebetween. The second fins 38 are perpendicularly mounted on the top of the upper base plate 34 of the conducting member 30 and located above the first fins 36. The second fins 38 define a plurality of second air passages (not labeled) therebetween, parallel to the first air passages of the first fins 36. The second fins 38 define a through hole 380 perpendicularly extending therethrough. A bottom of the second fins 38 define a pair of grooves 382 corresponding to the grooves 342 of the upper base plate 34 of the conducting member 30. The through hole 380 is defined above the groove 382. Each of the first fins 36 is parallel to each of the second fins 38, and perpendicular to the upper base plate 34 of the conducting member 30.

The heat pipes 40 comprise a pair of first heat pipes 42 and a second heat pipe 44. The first and second heat pipes 42, 44 comprise evaporating portions 420, 440, condensing portions 422, 442 parallel to the evaporating portion 420, 440, and adiabatic portions 423, 443 interconnecting the evaporating portions 420, 440 and the condensing portions 422, 442. The evaporating portions 420, 440 are received in channels cooperatively formed by the grooves 124 of the heat spreader 12 and the grooves defined in the bottom of the lower base plate 32 of the conducting member 30. Thus, the heat spreader 12 and the bottom of the conducting member 30 are thermally coupled together. The condensing portions 422 of the first heat pipes 42 are received in channels cooperatively formed by the grooves 342 of the upper base plate 34 of the conducting member 30 and the grooves 382 defined in the bottom of the second fins 38. The condensing portion 442 of the second heat pipe 44 is received in the through hole 380 defined in the second fins 38.

The fan 20 is mounted adjacent to openings of the first and second air passages of the first and the second fins 36, 38 so as to provide a forced airflow through the first fins 36 and the second fins 38 for facilitating heat dissipation of the fins 36, 38. By the forced airflow, the heat dissipation effectiveness of the heat dissipation device can be further promoted.

When the heat dissipation device is applied to the heat-generating electronic element, the bottom surface 120 of the heat spreader 12 contacts the electronic element and draws heat therefrom. The heat fast spreads on the heat spreader 12. Then, one part of the heat on the heat spreader 12 is conducted to the evaporating portions 420, 440 of the heat pipes 40. Another part of the heat on the heat spreader 12 is transferred to the lower base plate 32 of the conducting member 30, and then transferred to the upper base plate 34 via the connecting portion 33 of the conducting member 30 and then conducted to the first and second fins 36,38 for dissipation to an environment directly through the first and second fins 36,38. The heat absorbed by the evaporating portions 420 of the first heat pipes 42 is directly transferred to the top of the conducting member 30 and the bottom of the second fins 38 which are thermally connected to the condensing portions 422 of the first heat pipes 42. The heat transferred to the top of the conducting member 30 is then conducted to the first and second fins 36,38. Thus, the heat is dissipated to the environment through the first and second fins 36, 38. The heat absorbed by the evaporating portion 440 of the second heat pipe 44 is directly transferred to the second fins 38 via the condensing portion 442 to be dissipated to the environment. Thus, the heat can be quickly transferred to the top of the conducting member 30 via the connecting portion 33 of the conducting member 30 and the first heat pipes 42 and to the second fins 38 via the first and second heat pipes 42, 44. The top of the conducting member 30 and the condensing portions 422, 442 of the heat pipes 40 can be quickly cooled via the first and second fins 36, 38. A large temperature gradient is thus achieved between the top and the bottom of the conducting member 30 and the condensing portions 422, 442 and the evaporating portions 420, 440 of the heat pipes 40. A result of the large temperature gradient is that the heat pipes 40 are sufficiently used to transfer the heat from the heat spreader 12 where the highest temperature exists to the top of the conducting member 30 where the lowest temperature exists, to efficiently dissipate the heat of the heat-generating electronic component. Therefore, the heat of the heat-generating electronic component is continuously transferred to the top of the conducting member 30 and the condensing portions 422, 442 of the heat pipes 40 via the evaporating portions 420, 440 of the heat pipes 40 and dissipated by the fins 36, 38 to ambient air. The heat dissipation efficiency of the heat sink 10 can thus be improved.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device for a heat-generating electronic component, comprising:
   a heat spreader having a bottom surface adapted for thermally contacting the electronic component and a top surface opposite to the bottom surface;
   a conducting member thermally coupled with the top surface of the heat spreader, with a plurality of first fins extending downwardly from a top of the conducting member, pointed toward a base of the conducting member and spaced from the base a distance, a plurality of first passages formed between the first fins and extending along a front-to-back direction, the conducting member comprising an upper base plate at the top, a lower base plate at the base and spaced from the upper base plate a distance, and a connecting portion interconnecting the upper base plate and the lower base plate;
   a plurality of second fins extending upwardly from the top of the conducting member, a plurality of second passages formed between the second fins and extending along the front-to-back direction;
   a fan mounted on a back side of the first and second fins, the fan providing airflow to the first and second fins along the front-to-back direction; and
   a heat pipe thermally connecting the heat spreader with the conducting member and the second fins, the heat pipe comprising an evaporating portion sandwiched between the heat spreader and the lower base plate and a condensing portion sandwiched between the upper base plate and the second fins, wherein the evaporating portion and the condensing portion of the heat pipe are parallel to each other and extend along a lateral direction perpendicular to the front-to-back direction.

2. The heat dissipation device as described in claim 1, wherein the upper base plate is longer than the lower base plate.

3. The heat dissipation device as described in claim 2, wherein the upper and lower base plates and the first fins are integrally fabricated by metal extrusion.

4. The heat dissipation device as described in claim 1, where the connecting portion interconnects middle portions of the upper and lower base plates.

5. The heat dissipation device as described in claim 1, wherein the connecting portion divides the first fins into two groups, and the two groups of the first fins locate at opposite two sides of the connecting portion, respectively.

6. The heat dissipation device as described in claim 1, wherein the first and the second fins are perpendicular to the heat spreader.

7. A heat dissipation device comprising:
   a heat spreader;
   a conducting member mounted on the heat spreader, and comprising an upper base plate having a plurality of first fins perpendicularly extending therefrom, a lower base plate parallel to the upper base plate and a connecting portion interconnecting the upper base plate and the lower base plate, wherein the first fins extends from the upper base plate toward the lower base plate; and
   a first heat pipe thermally connecting the heat spreader and the conducting member;
   wherein a bottom surface of the first fins in whole defines a horizontal plane parallel to the lower base plate, the bottom surface of the first fins in whole is located above the lower base plate and there is a constant interval distance between the bottom surface of the first fins in whole and a top surface of the lower base plate.

8. The heat dissipation device as described in claim 7, wherein the first fins are located between the upper base plate and the lower base plate, and arrayed into two groups separated by the connecting portion of the conducting member.

9. The heat dissipation device as described in claim 7, wherein the upper and lower base plates and the first fins are integrally fabricated by metal extrusion, and there is a space between a bottom of the first fins and the lower base plate.

10. The heat dissipation device as described in claim 7, wherein the first heat pipe comprises an evaporating portion sandwiched between the heat spreader and the lower base plate, a condensing portion parallel to the evaporating portion and sandwiched between the conducting member and the second fins, and an adiabatic portion interconnecting the evaporating portion and the condensing portion.

11. The heat dissipation device as described in claim 7, further comprising a plurality of second fins mounted on the upper base plate of the conducting member.

12. The heat dissipation device as described in claim 11, further comprising a second heat pipe, wherein the second heat pipe comprises an evaporating portion sandwiched between the heat spreader and the lower base plate, a condensing portion parallel to the evaporating portion and extending through the second fins, and an adiabatic portion interconnecting the evaporating portion and the condensing portion.

13. The heat dissipation device as described in claim 7, further comprising a fan mounted adjacent to openings of air passages of the first fins.

14. A heat dissipation device for an electronic component comprising:
   a first heat sink having a lower base plate adapted from thermally connecting with the electronic component, an upper base plate and a plurality of first fins extending from the upper base plate downwardly towards the lower base plate and spaced a distance from the lower base plate;
   a first heat pipe having an evaporating portion located near and thermally connecting with the lower base plate and a condensing portion located near and thermally connecting with the upper base plate of the first heat sink; and
   a second heat sink mounted on the first heat sink, and a second heat pipe, the condensing portion of the first heat pipe is sandwiched between the first and second heat sinks, the second heat pipe having an evaporating portion located near and thermally connecting with the lower base plate and a condensing portion engaging with the second heat sink;
   wherein the first heat sink has a connecting portion interconnecting middle portions of the upper base plate and the lower base plate, the first fins being divided into two groups by the connecting portion; and
   wherein the second heat sink has a plurality of second fins, and the condensing portion of the second heat pipe engages in the second fins.

* * * * *